(12) United States Patent
Liu

(10) Patent No.: US 8,792,294 B2
(45) Date of Patent: Jul. 29, 2014

(54) DRAM AND ACCESS AND OPERATING METHOD THEREOF

(71) Applicant: MediaTek Inc., Hsin-Chu (TW)

(72) Inventor: Der-Ping Liu, Dayuan Township, Taoyuan County (TW)

(73) Assignee: Mediatek Inc., Hsin-Chu (TW)

( * ) Notice: Subject to any disclaimer, the term of this patent is extended or adjusted under 35 U.S.C. 154(b) by 26 days.

(21) Appl. No.: 13/728,134

(22) Filed: Dec. 27, 2012

(65) Prior Publication Data

US 2013/0176807 A1 Jul. 11, 2013

Related U.S. Application Data

(60) Provisional application No. 61/584,612, filed on Jan. 9, 2012.

(51) Int. Cl.
*G11C 8/00* (2006.01)

(52) U.S. Cl.
USPC .............. 365/230.03; 365/230.06; 365/189.05

(58) Field of Classification Search
CPC .......... G11C 8/18; G11C 8/06; G11C 7/1006; G11C 7/1078; G11C 7/10; G11C 7/1066
USPC ............ 365/230.03, 230.06, 189.05, 230.09, 365/189.19
See application file for complete search history.

(56) References Cited

U.S. PATENT DOCUMENTS 7,277,356 B2 * 10/2007 Lee et al. ................. 365/230.06

* cited by examiner

*Primary Examiner* — David Lam
(74) *Attorney, Agent, or Firm* — McClure, Qualey & Rodack, LLP

(57) ABSTRACT

An access method for a DRAM is provided. A row address is partitioned into a first portion and a second portion. The first portion of the row address via an address bus and a first active command via a command bus are provided to the DRAM. The second portion of the row address via the address bus and a second active command via the command bus are provided to the DRAM after the first active command is provided. A column address via the address bus and an access command via the command bus are provided to the DRAM after the second active command is provided. The address bus is formed by a plurality of address lines, and a quantity of the address lines is smaller than the number of bits of the row address, and the access command is a read command or a write command.

20 Claims, 10 Drawing Sheets

DRAM AND ACCESS AND OPERATING METHOD THEREOF

CROSS REFERENCE TO RELATED APPLICATIONS

This Application claims priority of U.S. Provisional Application No. 61/584,612, filed on Jan. 9, 2012, the entirety of which is incorporated by reference herein.

BACKGROUND OF THE INVENTION

1. Field of the Invention

The invention relates to a dynamic random access memory (DRAM), and more particularly, to an access and operating method of a DRAM for reducing address numbers thereof.

2. Description of the Related Art

A dynamic random access memory (DRAM) has existed for several years. The dramatic increase in storage capacity thereof, has been achieved via advances in semiconductor fabrication technology and circuit design technology. Considerable advances have also resulted in higher and higher levels of integration that permit dramatic reductions in memory array size and cost, as well as increased process yield.

Modern DRAM semiconductor memories require more area on semiconductor chips, despite the fact that structures for the rapidly increasing memory capacities are becoming smaller, and the memory cell fields thereof are becoming larger. The area requirement is associated with considerable production costs. Apart from the memory cell fields, a significant proportion of the area of a semiconductor memory chip is occupied by control, address and data lines, some of which are disposed alongside the memory cell fields and are becoming wider with the increasing memory capacity of the semiconductor memory, and by control devices which are required for operation of the data memory.

A DRAM receives a plurality of input signals from a controller, wherein the input signals define parameters such as the location, or address, of the memory data and transmit the memory data. A read or write transaction with a DRAM generally involves two steps. First, address (e.g. row address and column address) and control signals are transmitted to the DRAM, allowing the DRAM to prepare for the data transfer. Second, the DRAM reads or writes the data, completing the data transfer. However, for the controller, pins corresponding to the control, address and data lines also occupy a larger area. In general, the controller is implemented in an integrated circuit (IC). Therefore, a pad limitation problem of the IC often occurs, so that the size of the IC can not be minimized.

BRIEF SUMMARY OF THE INVENTION

A dynamic random access memory (DRAM) and access and operating methods thereof are provided. An embodiment of an access method for a DRAM is provided. A row address is partitioned into a first portion and a second portion. The first portion of the row address via an address bus and a first active command via a command bus are provided to the DRAM. The second portion of the row address via the address bus and a second active command via the command bus are provided to the DRAM after the first active command is provided. A column address via the address bus and an access command via the command bus are provided to the DRAM after the second active command is provided. The address bus is formed by a plurality of the address lines is smaller than the number of bits of the row address, and the access command is a read command or a write command.

Furthermore, another embodiment of an access method for a DRAM is provided. A column address is partitioned into a first portion and a second portion. A row address via an address bus and an active command via a command bus are provided to the DRAM. The first portion of the column address via the address bus and a specific command via the command bus are provided to the DRAM after the active command is provided. The second portion of the column address via the address bus and an access command via the command bus are provided to the DRAM after the specific command is provided. The address bus is formed by a plurality of address lines, and a quantity of the address lines is smaller than the number of bits of the column address, and the access command is a read command or a write command.

Moreover, an embodiment of an operating method for a DRAM is provided. A first address via an address bus and a first command via a command bus from a controller are obtained. A second address via the address bus and a second command via the command bus from the controller are obtained after the first command is obtained. The first address and the second address are combined to obtain a valid address. A third address via the address bus and a third command via the command bus from the controller are obtained. The valid address is a row address and the third address is a column address when each of the first command and the second command is an active command and the third command is an access command. The valid address is a column address and the third address is a row address when the second command is the access command and the third command is the active command.

Furthermore, an embodiment of a DRAM is provided. The DRAM comprises: an address combination circuit, comprising: a storage unit; a first selector, storing a first address from a controller via an address bus into the storage unit according to a first command from the controller via a command bus; a second selector, obtaining the first address stored in the storage unit according to a second command from the controller via the command bus; and a combination unit, obtaining a second address from the controller via the address bus according to the second command, and providing a valid address according to the first address and the second address; an address decoder, obtaining a third address from the controller via the address bus according to a third command from the controller via the command bus; and a memory array, storing data from the controller via a data bus in response to the valid address and the third address when the third command is a write command, and providing data to the controller via the data bus in response to the valid address and the third address when the third command is a read command The valid address is a row address and the third address is a column address when each of the first command and the second command is an active command. The valid address is a column address when the second command is the access command.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
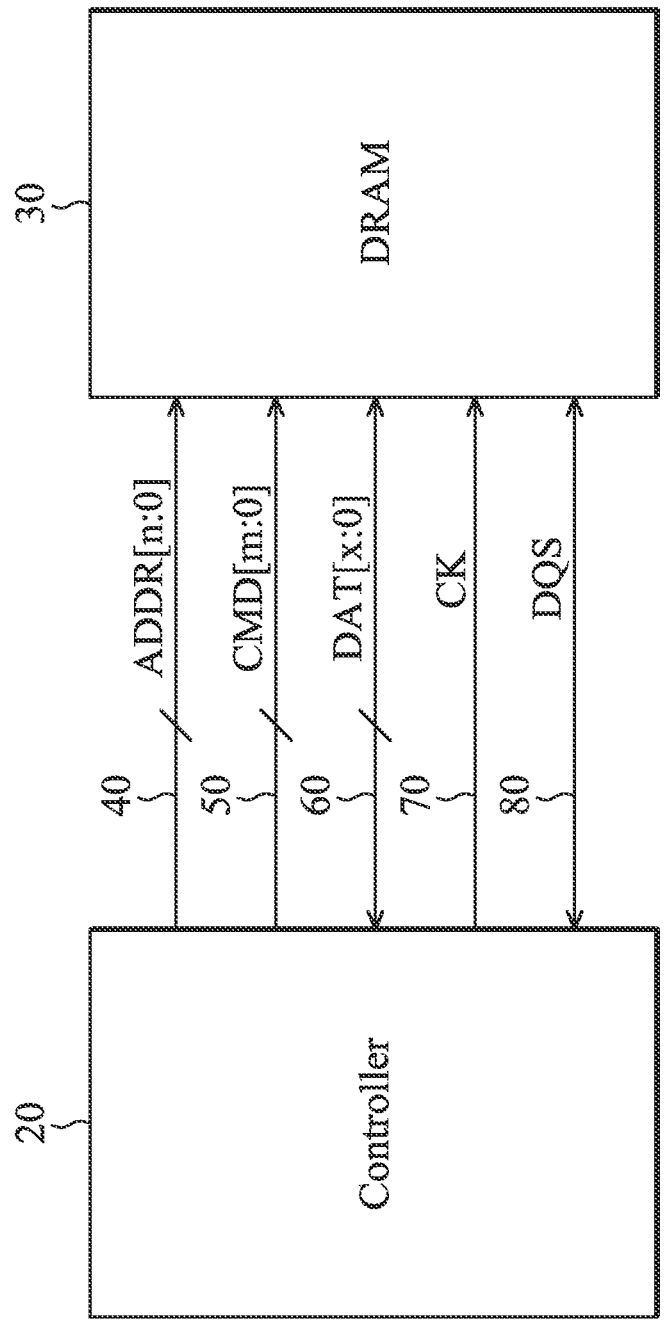
FIG. 1 shows an electronic device according to an embodiment of the invention.

FIG. 1 shows an electronic device 10 according to an embodiment of the invention. The electronic device 10 comprises a controller 20 and a dynamic random access memory (DRAM) 30. Furthermore, the electronic device 10 further comprises a plurality of buses 40, 50 and 60 between the controller 20 and the DRAM 30. The bus 40 is an address bus for providing an address signal ADDR[n:0] from the controller 20 to the DRAM 30. The bus 50 is a command bus for providing a command signal CMD[m:0] from the controller 20 to the DRAM 30. The bus 60 is a data bus for transferring a data signal DAT[x:0] between the controller 20 and the DRAM 30. Furthermore, the electronic device 10 further comprises the transmission lines 70 and 80 between the controller 20 and the DRAM 30. The transmission line 70 is used to provide a clock signal CK from the controller 20 to the DRAM 30. The transmission line 80 is used to transfer a data strobe signal DQS between the controller 20 and the DRAM 30. It is to be noted that the address bus 40 is formed by a plurality of address lines, and a quantity of the address lines is smaller than a maximum number of bits between the row address and the column address, which is to be provided to the DRAM 30. Thus, pin counts of the controller 20 and the DRAM 30 are reduced.

Figure 2:
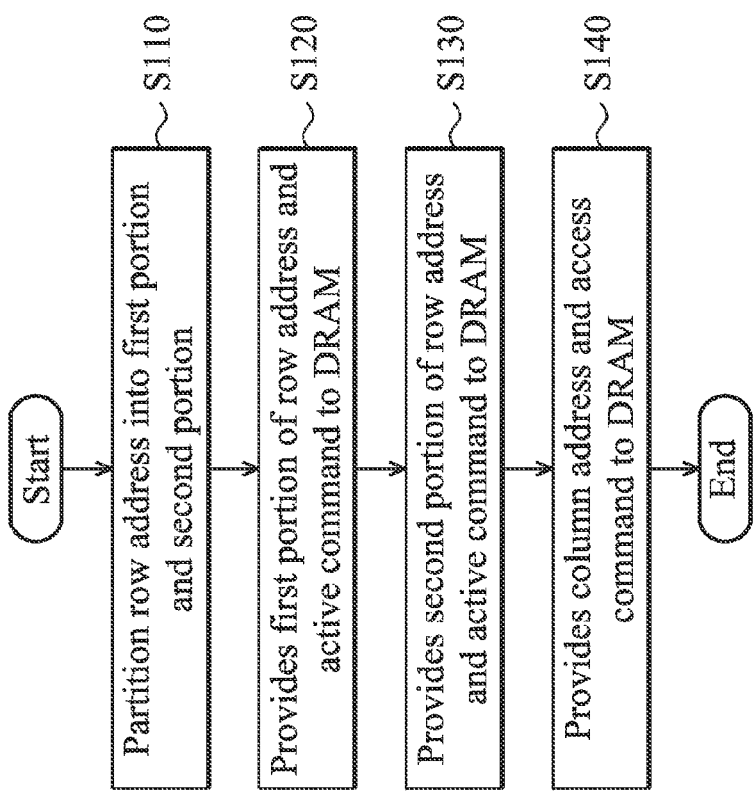
FIG. 2 shows an access method for a DRAM according to an embodiment of the invention, wherein the access method is performed by a controller.
Figure 3:
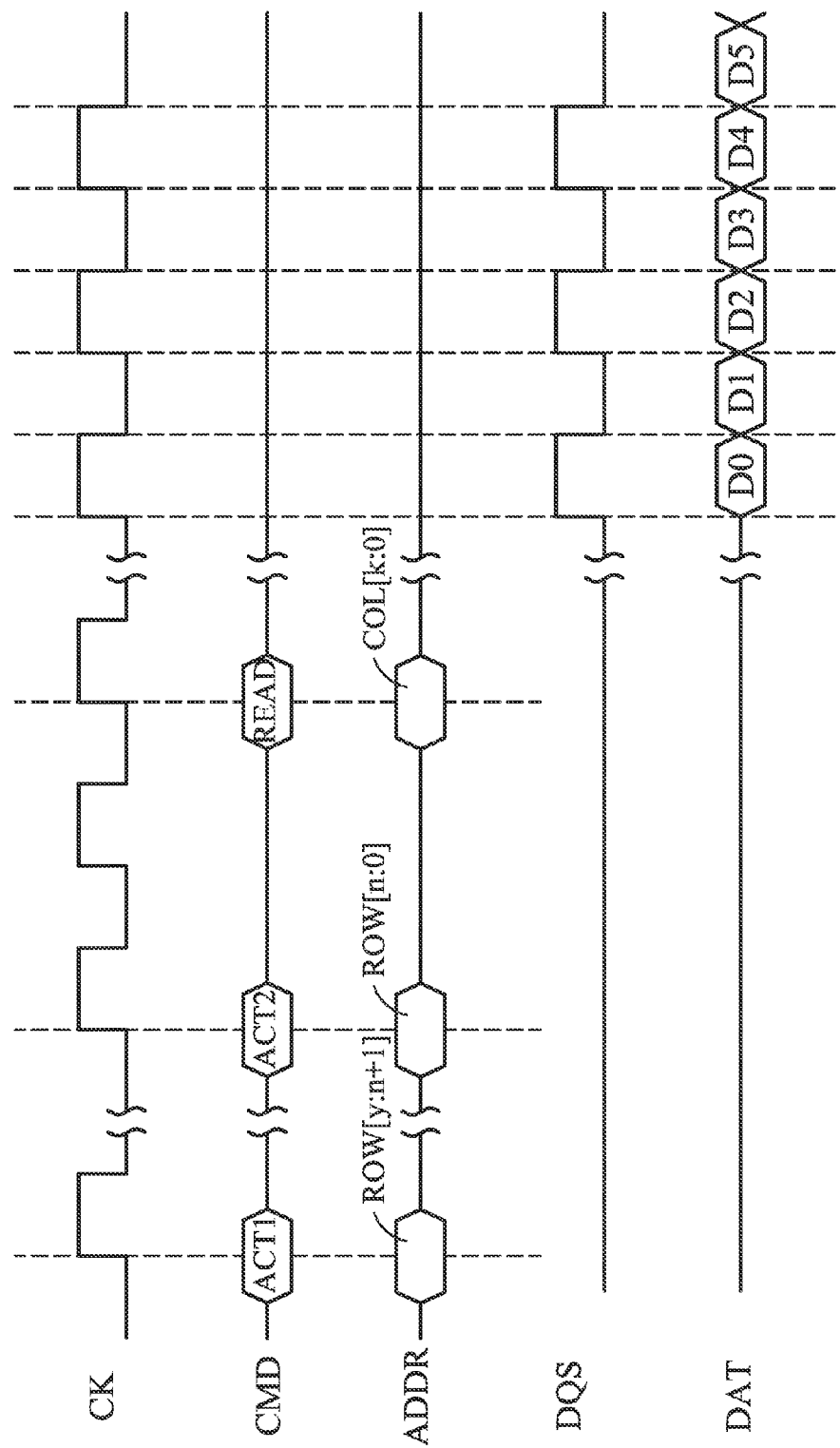
FIG. 3 shows a waveform illustrating the signals of the controller of FIG. 2 according to an embodiment of the invention.

FIG. 2 shows an access method for a DRAM (e.g. 30 of FIG. 1) according to an embodiment of the invention, wherein the access method is performed by a controller (e.g. 20 of FIG. 1). FIG. 3 shows a waveform illustrating the signals of the controller of FIG. 2 according to an embodiment of the invention. Referring to FIG. 2 and FIG. 3 together, first, in step S110, a row address ROW[y:0], which is to be transmitted to the DRAM, is partitioned into a first portion and a second portion, wherein the first portion of the row address comprises a plurality of most significant bits of the row address ROW[y:0], i.e. the high row address ROW[y:n+1], and the second portion of the row address comprises the remnant bits of the row address ROW[y:0], i.e. the low row address ROW[n:0]. Next, in step S120, the controller provides the first portion of the row address ROW[y:n+1] to the DRAM via an address bus (e.g. 40 of FIG. 1). Simultaneously, the controller provides an active command ACT1 to the DRAM via a command bus (e.g. 50 of FIG. 1), as shown in FIG. 3. Next, in step S130, the controller provides the second portion of the row address ROW[n:0] to the DRAM via the address bus. Simultaneously, the controller provides an active command ACT2 to the DRAM via the command bus, as shown in FIG. 3. Next, in step S140, the controller provides a column address COL[k:0] to the DRAM via the address bus. Simultaneously, the controller provides an access command to the DRAM via the command bus. If the access command is a read command READ, the DRAM provides the data DAT corresponding to the row address ROW[y:0] and the column address COL[k:0] to the controller via the data bus in response to the read command READ, as shown in FIG. 3. Furthermore, if the access command is a write command WRITE, the controller further provides the data to be stored, to the DRAM, and then the DRAM stores the data from the controller according to the row address ROW[y:0] and the column address COL[k:0]. It is to be noted that the active command ACT1, the active command ACT2 and the access command READ have the same bank addresses in FIG. 3. Furthermore, the number of bits of the row address ROW[y:0] is larger than a quantity of the address lines of the address bus, and the number of bits of the column address COL[k:0] is smaller than or equal to the quantity of the address lines of the address bus.

Figure 4A:
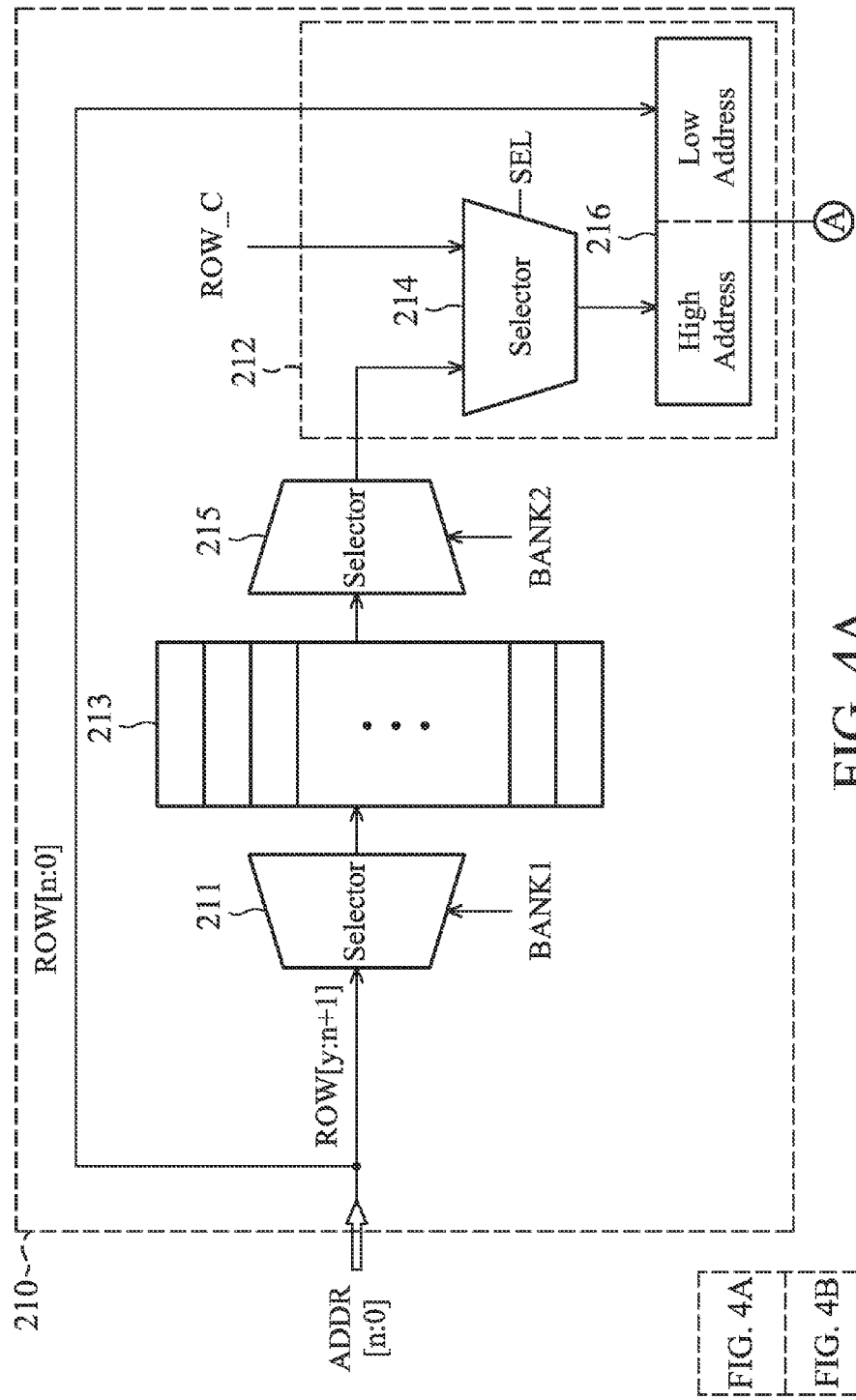
FIG. 4A and FIG. 4B show a DRAM according to an embodiment of the invention, wherein the DRAM is controlled by a controller that performs the access method of FIG. 2.
Figure 4B:
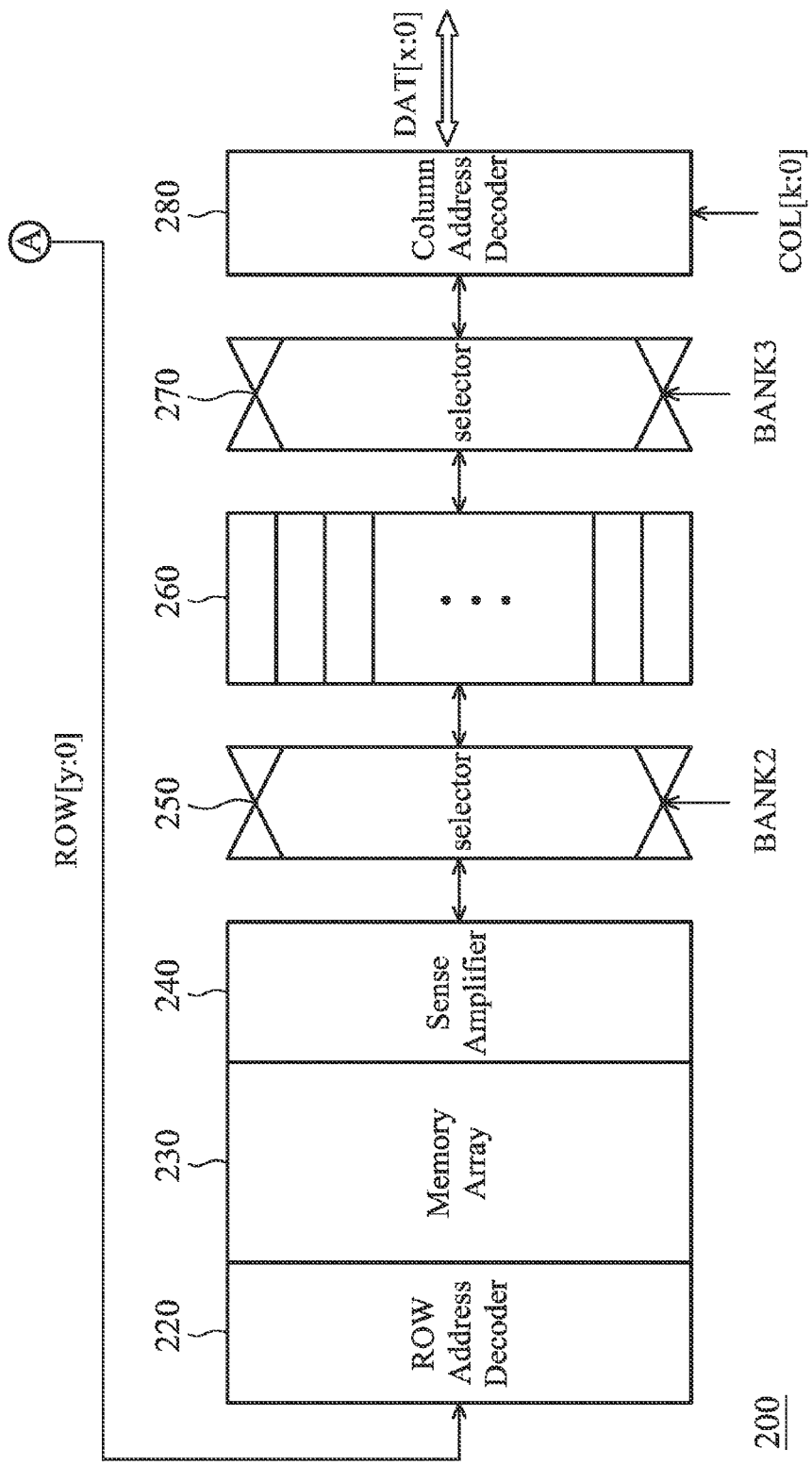

FIG. 4A and FIG. 4B show a DRAM 200 according to an embodiment of the invention, wherein the DRAM 200 is controlled by a controller that performs the access method of FIG. 2. The DRAM 200 comprises an address combination circuit 210, a row address decoder 220, a memory array 230, a sense amplifier 240, a selector 250, a storage unit 260, a selector 270 and a column address decoder 280. The address combination circuit 210 comprises a selector 211, a storage unit 213, a selector 215 and a combination unit 212, wherein the combination unit 212 comprises a multiplexer 214 and a buffer 216. Referring to FIG. 3 and FIGS. 4A and 4B together, first, the DRAM 200 receives the first portion of the row address ROW[y:n+1] from the controller via an address bus and receives the active command ACT1 from the controller via a command bus, wherein the active command ACT1 comprises a bank address BANK1. According to the bank address BANK1, the selector 211 stores the first portion of the row address ROW[y:n+1] into the storage unit 213. In the embodiment, the storage unit 213 comprises a plurality of sub-units, wherein each sub-unit corresponds to an individual bank address. For example, the selector 211 provides the first portion of the row address ROW[y:n+1] to the sub-unit of the storage unit 213 corresponding to the bank address BANK1. Next, the DRAM 200 receives the second portion of the row address ROW[n:0] from the controller via the address bus and receives the active command ACT2 from the controller via the command bus, wherein the active command ACT2 comprises a bank address BANK2 and the bank address BANK2 is identical to the bank address BANK1. According to the bank address BANK2, the selector 215 reads the first portion of the row address ROW[y:n+1] from the storage unit 213, and provides the first portion of the row address ROW[y:n+1] to the combination unit 212. In the combination unit 212, the selector 214 is used to selectively provide the address from the selector 215 or a constant address ROW_C according to a control signal SEL, wherein the control signal SEL and the constant address ROW_C may be provided by the controller or is set in advance. In the embodiment, the control signal SEL controls the selector 214 to provide the first portion of the row address ROW[y:n+1] to the buffer 216 as a high row address. Furthermore, the second portion of the row address ROW[n:0] is further transmitted to the buffer 216 as a low row address. Thus, the buffer 216 combines the high row address ROW[y:n+1] and the low row address ROW[n:0] to obtain a valid row address ROW[y:0]. Next, the row address decoder 220 decodes the row address ROW[y:0], and the memory array 230 provides the data corresponding to the decoded row address to the sense amplifier 240. According to the bank address BANK2, the selector 250 stores the data from the sense amplifier 240 into the storage unit 260. In the embodiment, the storage unit 260 also comprises a plurality of sub-units, wherein each sub-unit corresponds to an individual bank address. For example, the selector 250 stores the data from the sense amplifier 240 into the sub-unit of the storage unit 260 corresponding to the bank address BANK2. Next, the DRAM 200 receives the column address COL[k:0] from the controller via the address bus and the access command READ from the controller via the command bus, wherein the access command READ comprises a bank address BANK3 and the bank address BANK3 is also identical to the bank address BANK1. According to the bank address BANK3, the selector 270 reads the data corresponding to the row address ROW[y:0] from the storage unit 260, and provides the read data to the column address decoder 280. Next, the column address decoder 280 decodes the column address COL[k:0] to obtain the data DAT [x:0] according to the data from the selector 270, and provides the data DAT [x:0] to the controller via the data bus. On the contrary, if the access command is a write command, the column address decoder 280 decodes the column address COL[k:0], and the column address decoder 280 provides the data DAT[x:0] from the controller to the selector 270 according to the decoded column address. According to the bank address BANK3, the selector 270 stores the data from the column address decoder 280 into the storage unit 260. Next, according to the bank address BANK2, the selector 250 reads the data corresponding to the column address COL[k:0] from the storage unit 260, and provides the data to the sense amplifier 240. Thus, the data DAT[x:0] from the controller is stored into the memory array 230 according to the row address ROW[y:0] and the column address COL[k:0]. As described above, the bank addresses BANK1, BANK2 and BANK 3 are the same.

Figure 5:
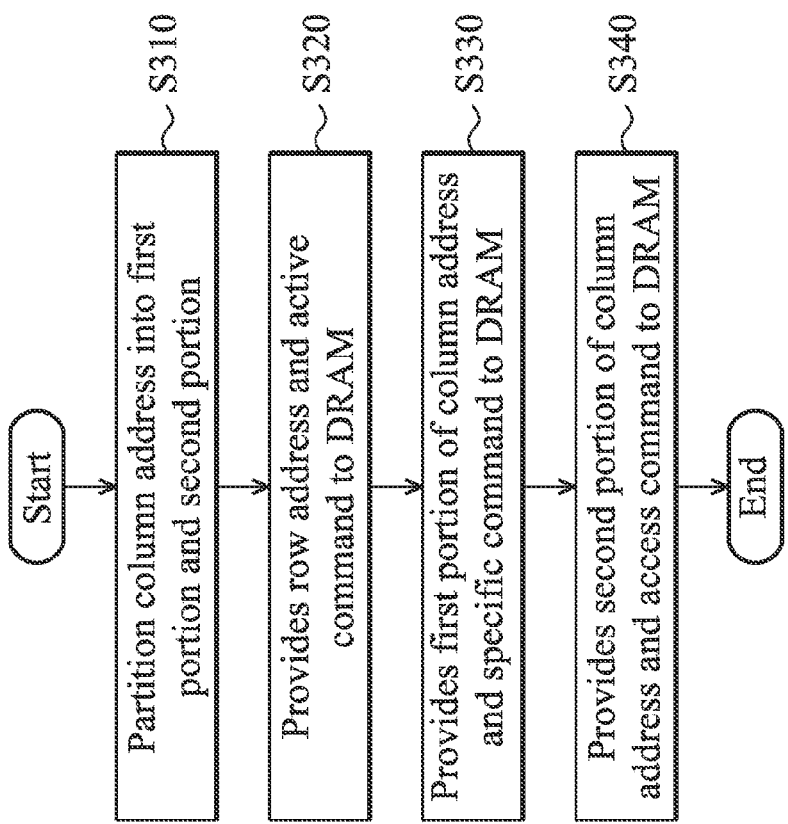
FIG. 5 shows an access method for a DRAM according to another embodiment of the invention, wherein the access method is performed by a controller.
Figure 6:
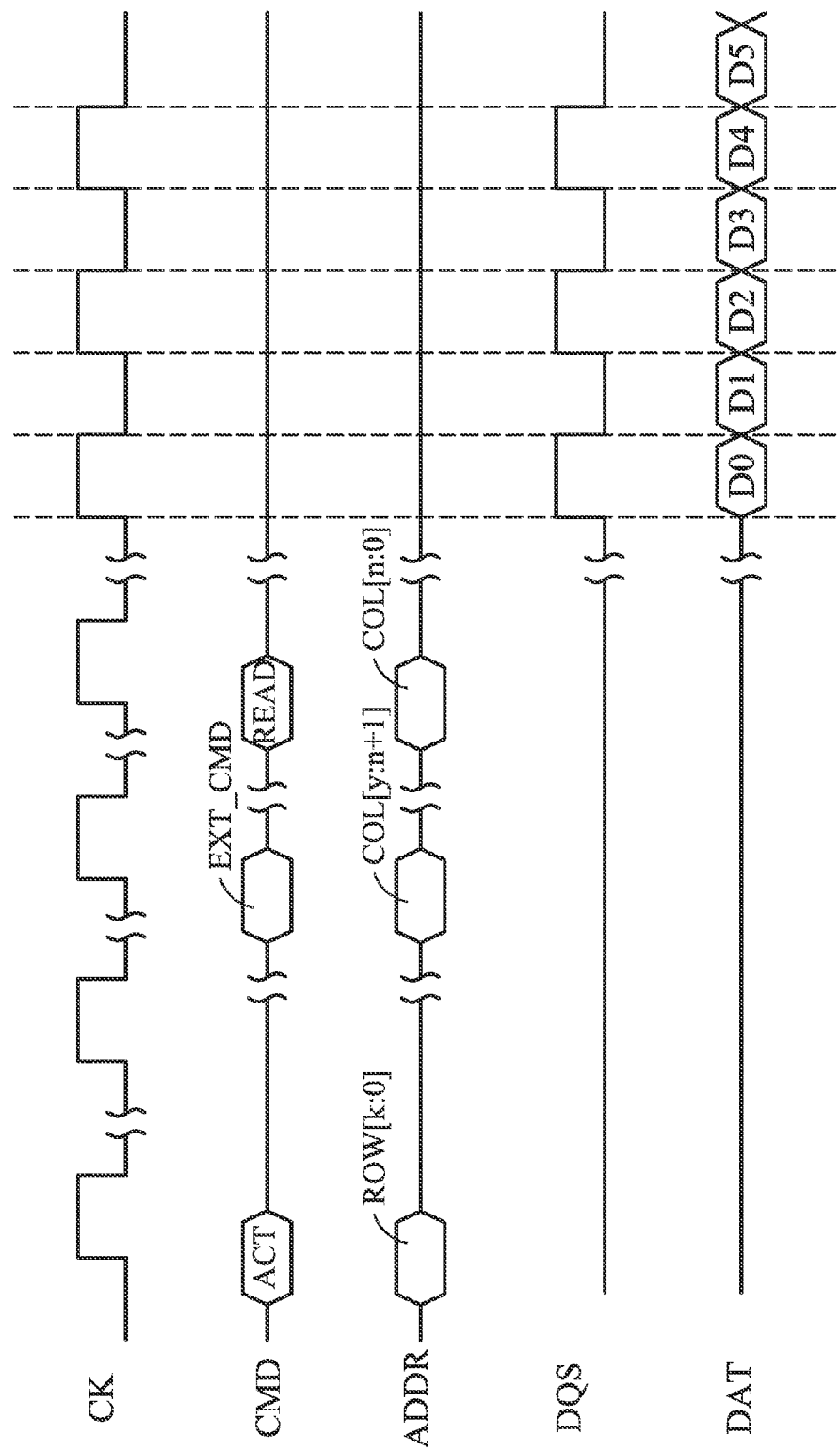
FIG. 6 shows a waveform illustrating the signals of the controller of FIG. 5 according to an embodiment of the invention.

FIG. 5 shows an access method for a DRAM (e.g. 30 of FIG. 1) according to another embodiment of the invention, wherein the access method is performed by a controller (e.g. 20 of FIG. 1). FIG. 6 shows a waveform illustrating the signals of the controller of FIG. 5 according to an embodiment of the invention. Referring to FIG. 5 and FIG. 6 together, first, in step S310, a column address COL[y:0], which is to be transmitted to the DRAM, is partitioned into a first portion and a second portion, wherein the first portion of the column address comprises a plurality of most significant bits of the column address COL[y:0], i.e. the high column address COL[y:n+1], and the second portion of the column address comprises the remnant bits of the column address COL[y:0], i.e. the low column address COL[n:0]. Next, in step S320, the controller provides a row address ROW[k:0] to the DRAM via an address bus (e.g. 40 of FIG. 1). Simultaneously, the controller provides an active command ACT to the DRAM via a command bus (e.g. 50 of FIG. 1). Next, in step S330, the controller provides the first portion of the column address COL[y:n+1] to the DRAM via the address bus. Simultaneously, the controller provides a specific command EXT_CMD to the DRAM via the command bus. Next, in step S340, the controller provides the second portion of the column address COL[n:0] to the DRAM via the address bus. Simultaneously, the controller provides an access command to the DRAM via the command bus. If the access command is a read command READ, the DRAM provides the data DAT corresponding to the row address ROW[k:0] and the column address COL[y:0] to the controller via the data bus in response to the read command READ, as shown in FIG. 6. Furthermore, if the access command is a write command WRITE, the controller further provides the data to be stored, to the DRAM, and then the DRAM stores the data from the controller according to the row address ROW[k:0] and the column address COL[y:0]. In the embodiment, the specific command EXT_CMD may be another active command ACT or another access command READ. It is to be noted that the active command ACT, the specific command EXT_CMD and the access command READ have the same bank addresses in FIG. 6. Furthermore, the number of bits of the column address COL[y:0] is larger than a quantity of the address lines of the address bus, and the number of bits of the row address ROW [k:0] is smaller than or equal to the quantity of the address lines of the address bus.

Figure 7A:
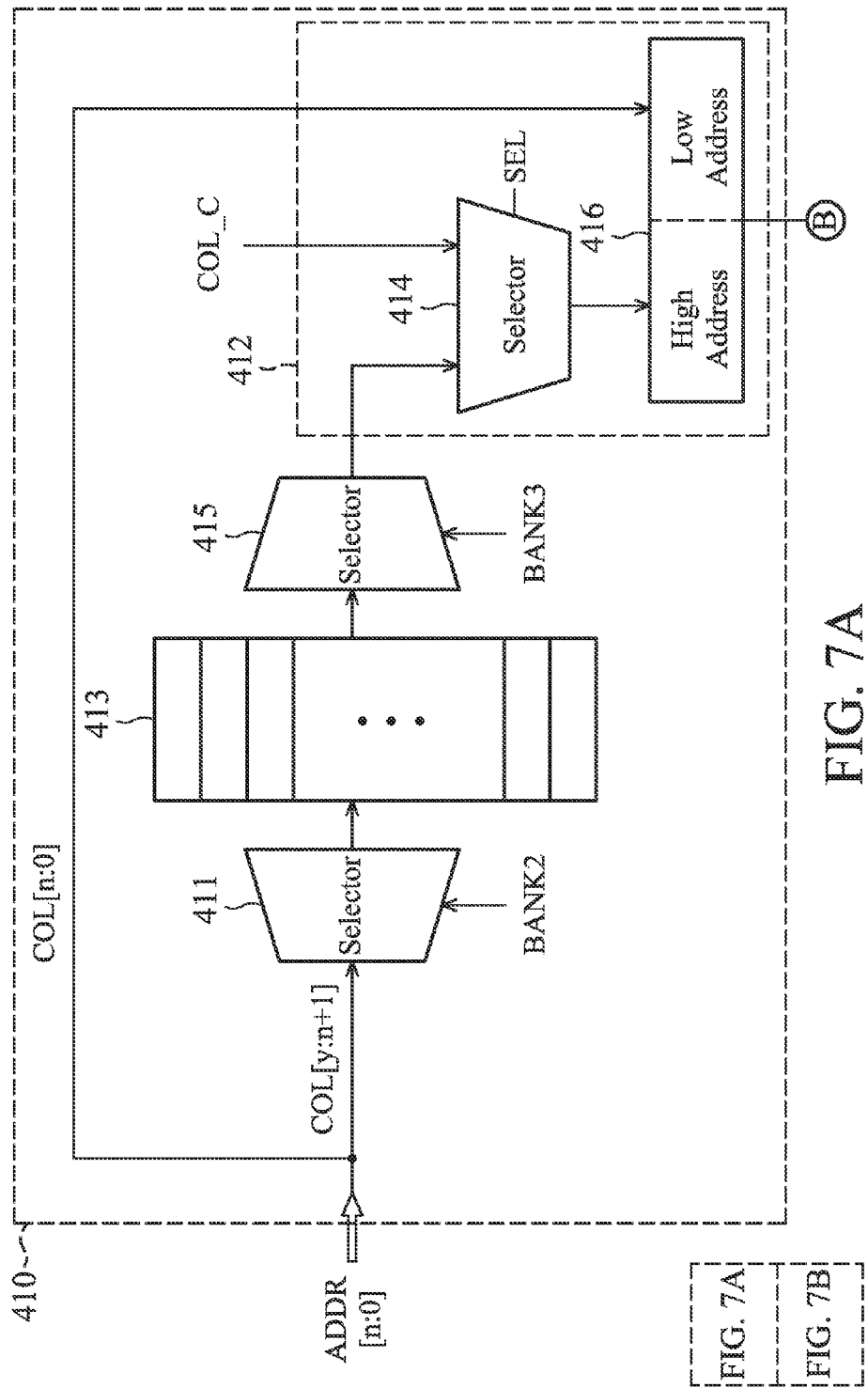
FIG. 7A and FIG. 7B show a DRAM according to an embodiment of the invention, wherein the DRAM is controlled by a controller that performs the access method of FIG. 5.
Figure 7B:
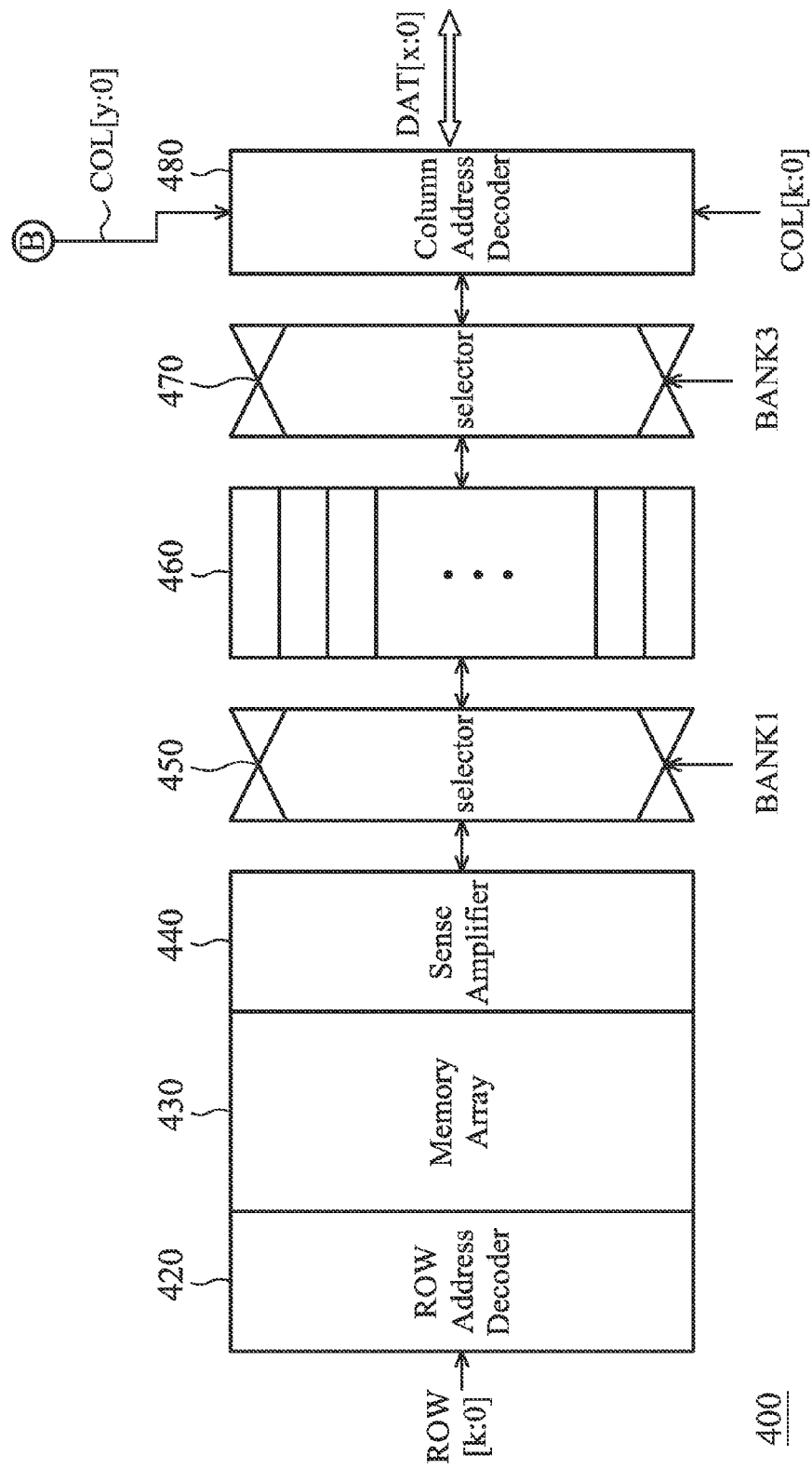

FIG. 7A and FIG. 7B show a DRAM 400 according to another embodiment of the invention, wherein the DRAM 400 is controlled by a controller that performs the access method of FIG. 5. The DRAM 400 comprises an address combination circuit 410, a row address decoder 420, a memory array 430, a sense amplifier 440, a selector 450, a storage unit 460, a selector 470 and a column address decoder 480. The address combination circuit 410 comprises a selector 411, a storage unit 413, a selector 415 and a combination unit 412, wherein the combination unit 412 comprises a multiplexer 414 and a buffer 416. Referring to FIG. 6 and FIGS. 7A and 7B together, first, the DRAM 400 receives the row address ROW[k:0] from the controller via an address bus and receives the active command ACT from the controller via a command bus, wherein the active command ACT comprises a bank address BANK1 for controlling the selector 450. Next, the DRAM 400 receives the first portion of the column address COL[y:n+1] from the controller via the address bus and receives the specific command EXT_CMD from the controller via the command bus, wherein the specific command EXT_CMD comprises a bank address BANK2 and the bank address BANK2 is identical to the bank address BANK1. According to the bank address BANK2, the selector 411 stores the first portion of the column address COL[y:n+1] into the storage unit 413. In the embodiment, the storage unit 413 comprises a plurality of sub-units, wherein each sub-unit corresponds to an individual bank address. For example, the selector 411 provides the first portion of the column address COL[y:n+1] to the sub-unit of the storage unit 413 corresponding to the bank address BANK2. Next, the DRAM 400 receives the second portion of the column address COL[n:0] from the controller via the address bus and receives the access command READ from the controller via the command bus, wherein the access command READ comprises a bank address BANK3 and the bank address BANK3 is identical to the bank address BANK1. According to the bank address BANK3, the selector 415 reads the first portion of the column address COL[y:n+1] from the storage unit 413, and provides the first portion of the column address COL[y:n+1] to the combination unit 412. In the combination unit 412, the selector 414 is used to selectively provide the address from the selector 415 or a constant address COL_C according to a control signal SEL, wherein the control signal SEL and the constant address COL_C may be provided by the controller or is set in advance. In the embodiment, the control signal SEL controls the selector 414 to provide the first portion of the column address COL[y:n+1] to the buffer 416 as a high column address. Furthermore, the second portion of the column address COL[n:0] is further transmitted to the buffer 416 as a low row address. Thus, the buffer 416 combines the high column address COL[y:n+1] and the low column address COL[n:0] to obtain a valid column address COL[y:0]. As described above, if the access command is a read command, the memory array 430 provides the data corresponding to the row address ROW[k:0] and the column address COL[y:0] as the data DAT[x:0], so as to provide the DAT[x:0] to the controller via the data bus. On the contrary, if the access command is a write command, the data DAT[x:0] from the controller is stored into the memory array 430 according to the row address ROW[k:0] and the column address COL[y:0].

Figure 8:
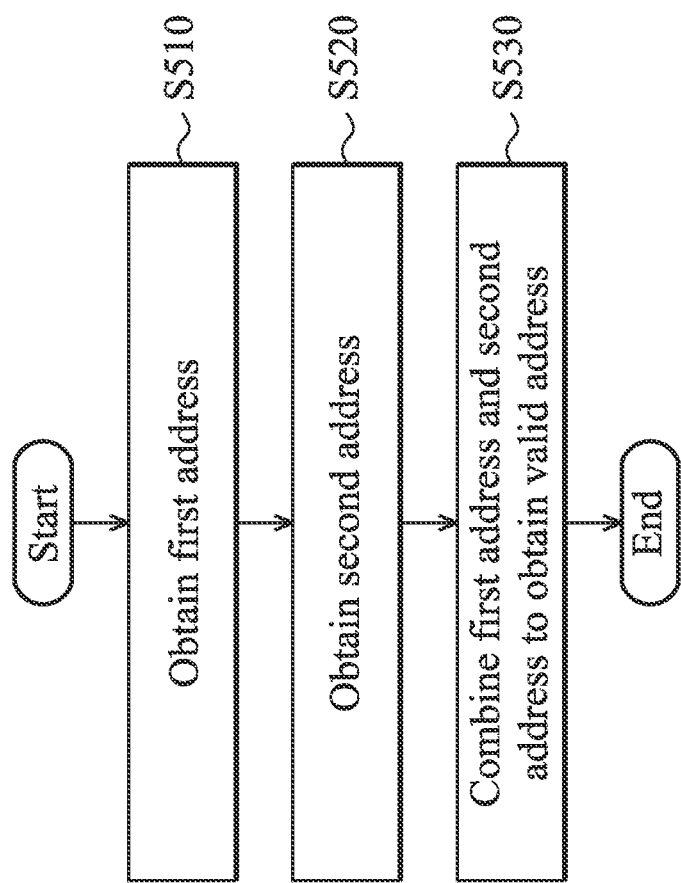
FIG. 8 shows an operating method for a DRAM according to an embodiment of the invention.

FIG. 8 shows an operating method for a DRAM according to an embodiment of the invention. In step S510, the DRAM obtains a first address via an address bus and a first command via a command bus from a controller. Next, in step S520, the DRAM obtains a second address via the address bus and a second command via the command bus from the controller. Next, in step S530, the DRAM combines the first address and the second address to obtain a valid address. As described above, if the valid address is a row address, each of the first and second commands is an active command. Furthermore, the DRAM further obtains a column address via the address bus and obtains an access command via the command bus from the controller. In response to the access command, the data from the controller is stored into the memory array of the DRAM or the data stored in the DRAM is provided to the controller according to the valid address and the column address. On the contrary, if the valid address is a column address, the first command is an active command or an access command, and the second is an access command. Furthermore, the DRAM further obtains a row address via the address bus and obtains an active command via the command bus from the controller before obtaining the first address. In response to the access command, the data from the controller is stored into the memory array of the DRAM or the data stored in the DRAM is provided to the controller according to the valid address and the row address.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An access method for a dynamic random access memory (DRAM), comprising:
    partitioning a row address into a first portion and a second portion;
    providing the first portion of the row address via an address bus and a first active command via a command bus to the DRAM;
    providing the second portion of the row address via the address bus and a second active command via the command bus to the DRAM after the first active command is provided; and
    providing a column address via the address bus and an access command via the command bus to the DRAM after the second active command is provided,
    wherein the address bus is formed by a plurality of address lines, and a quantity of the address lines is smaller than the number of bits of the row address, and the access command is a read command or a write command.

2. The access method as claimed in claim 1, wherein the first portion of the row address comprises a plurality of most significant bits of the row address, and the second portion of the row address comprises the remnant bits of the row address.

3. The access method as claimed in claim 1, wherein the first active command, the second active command and the access command comprise the same bank addresses.

4. An access method for a dynamic random access memory (DRAM), comprising:
    partitioning a column address into a first portion and a second portion;
    providing a row address via an address bus and an active command via a command bus to the DRAM;
    providing the first portion of the column address via the address bus and a specific command via the command bus to the DRAM after the active command is provided; and
    providing the second portion of the column address via the address bus and an access command via the command bus to the DRAM after the specific command is provided,
    wherein the address bus is formed by a plurality of address lines, and a quantity of the address lines is smaller than the number of bits of the column address, and the access command is a read command or a write command.

5. The access method as claimed in claim 4, wherein the first portion of the column address comprises a plurality of most significant bits of the column address, and the second portion of the column address comprises the remnant bits of the column address.

6. The access method as claimed in claim 4, wherein the specific command, the access command and the active command comprise the same bank addresses.

7. The access method as claimed in claim 4, wherein the specific command is identical to the active command or the access command.

8. An operating method for a dynamic random access memory (DRAM), comprising:
    obtaining a first address via an address bus and a first command via a command bus from a controller;
    obtaining a second address via the address bus and a second command via the command bus from the controller after the first command is obtained;
    combining the first address and the second address to obtain a valid address; and
    obtaining a third address via the address bus and a third command via the command bus from the controller,
    wherein the valid address is a row address and the third address is a column address when each of the first command and the second command is an active command and the third command is an access command,
    wherein the valid address is a column address and the third address is a row address when the second command is the access command and the third command is the active command.

9. The operating method as claimed in claim 8, further comprising:
    storing the first address into a storage unit according to the first command; and
    reading the first address from the storage unit according to the second command,
    wherein the access command and the active command comprise the same bank addresses.

10. The operating method as claimed in claim 8, wherein when the valid address is the column address and the third address is the row address, the first command is identical to the active command or the access command.

11. The operating method as claimed in claim 8, further comprising:
   storing data from the controller into a memory array of the DRAM according to the valid address and the third address when the access command is a write command; and
   providing data stored in the memory array of the DRAM to the controller according to the valid address and the third address when the access command is a read command.

12. The operating method as claimed in claim 11, wherein the specific command, the access command and the active command comprise the same bank addresses.

13. The operating method as claimed in claim 8, wherein the first address comprises a plurality of most significant bits of the row address and the second address comprises the remnant bits of the row address when the valid address is the row address, and the address bus is formed by a plurality of address lines and a quantity of the address lines is smaller than the number of bits of the row address.

14. The operating method as claimed in claim 8, wherein the first address comprises a plurality of most significant bits of the column address and the second address comprises the remnant bits of the column address when the valid address is the column address, and the address bus is formed by a plurality of address lines and a quantity of the address lines is smaller than the number of bits of the column address.

15. A dynamic random access memory (DRAM), comprising:
   an address combination circuit, comprising:
      a storage unit;
      a first selector, storing a first address from a controller via an address bus into the storage unit according to a first command from the controller via a command bus;
      a second selector, obtaining the first address stored in the storage unit according to a second command from the controller via the command bus; and
      a combination unit, obtaining a second address from the controller via the address bus according to the second command, and providing a valid address according to the first address and the second address;
   an address decoder, obtaining a third address from the controller via the address bus according to a third command from the controller via the command bus; and
   a memory array, storing data from the controller via a data bus in response to the valid address and the third address when the third command is a write command, and providing data to the controller via the data bus in response to the valid address and the third address when the third command is a read command,
   wherein the valid address is a row address and the third address is a column address when each of the first command and the second command is an active command, and
   wherein the valid address is a column address when the second command is an access command.

16. The DRAM as claimed in claim 15, wherein the first, second and third commands comprise a specific bank address.

17. The DRAM as claimed in claim 16, wherein the storage unit comprises a plurality of sub-units, and the first address is stored in the sub-unit of the storage unit corresponding to the specific bank address.

18. The DRAM as claimed in claim 15, wherein the first address comprises a plurality of most significant bits of the row address and the second address comprises the remnant bits of the row address when the valid address is the row address, and the address bus is formed by a plurality of address lines and a quantity of the address lines is smaller than the number of bits of the row address.

19. The DRAM as claimed in claim 15, wherein the first address comprises a plurality of most significant bits of the column address and the second address comprises the remnant bits of the column address when the valid address is the column address, and the address bus is formed by a plurality of address lines and a quantity of the address lines is smaller than the number of bits of the column address.

20. The DRAM as claimed in claim 15, wherein when the valid address is the column address and the third address is the row address, the first command is identical to the active command or the access command.

* * * * *